(12) United States Patent
Oikawa et al.

(10) Patent No.: US 6,778,394 B2
(45) Date of Patent: Aug. 17, 2004

(54) ELECTRONIC DEVICE HAVING A HEAT DISSIPATION MEMBER

(75) Inventors: Hironori Oikawa, Hadano (JP);
Takeshi Hizono, Yokohama (JP);
Katsuya Sato, Zama (JP)

(73) Assignee: Hitachi, Ltd., Toyko (JP)

( * ) Notice: Subject to any disclaimer, the term of this patent is extended or adjusted under 35 U.S.C. 154(b) by 0 days.

(21) Appl. No.: 10/414,152

(22) Filed: Apr. 16, 2003

(65) Prior Publication Data

US 2004/0070949 A1 Apr. 15, 2004

(30) Foreign Application Priority Data

Sep. 25, 2002 (JP) .......................................... 2002-279570

(51) Int. Cl.⁷ ................................................. H05K 7/20
(52) U.S. Cl. ....................... 361/700; 361/695; 361/699; 361/704; 257/715; 257/722; 165/80.3; 165/80.4; 165/104.26; 174/15.2
(58) Field of Search ................................. 361/690, 693, 361/695, 699, 700, 704, 719; 174/15.2, 16.3; 165/80.3, 104.26; 257/714–715, 722

(56) References Cited

U.S. PATENT DOCUMENTS 6,166,907 A * 12/2000 Chien .......................... 361/699
6,407,916 B1 * 6/2002 Konstad ....................... 361/687
6,418,018 B1 * 7/2002 Lo ............................... 361/700
6,437,982 B1 * 8/2002 Cardenas ..................... 361/700
6,459,576 B1 * 10/2002 Bhatia et al. ............... 361/687
6,560,104 B2 * 5/2003 DeHoff et al. .............. 361/687
2002/0053421 A1 * 5/2002 Hisano et al. ......... 165/104.33
2002/0080581 A1 * 6/2002 Lo ............................... 361/700

FOREIGN PATENT DOCUMENTS

JP          10-50910          2/1998
JP          10-213370         8/1998

* cited by examiner

*Primary Examiner*—Boris Chérvinsky
(74) *Attorney, Agent, or Firm*—Mattingly, Stanger & Malur, P.C.

(57) ABSTRACT

In order to efficiently cool highly heat generating components mounted on an electronic device, it is necessary to provide a large heat sink, which is the heat dissipation member, and this entails the problem of an enlarged device size and accordingly an increased installation space. A heat receiving member is attached to a heat generating component installed in a housing, a fan for discharging air within the housing out of the housing is attached on a part of a wall of the housing, a heat sink having a base and fins arranged on the base is attached opposite the fan on an outer face of the wall of the housing or protruding out of the wall with the fins facing the housing, and the heat sink and the heat receiving member are connected by heat transport means.

18 Claims, 7 Drawing Sheets

ELECTRONIC DEVICE HAVING A HEAT DISSIPATION MEMBER

BACKGROUND OF THE INVENTION

The present invention relates to an electronic device having a heat dissipation member for heat generating electronic components such as a CPU, and more particularly to a heat dissipating structure using heat transfer radiating means such as heat pipes and liquid cooling devices.

In recent years, devices and integrated circuits, especially CPUs, to be used in personal computers, servers and the like, have significantly increased in operating speed, and accompanied therewith, an amount of heat generation has increased. Currently, cooling a CPU is mainly accomplished by a direct air cooling system in which the CPU is fixed to a heat sink, and a fan is attached to it and cooling air is blown to the heat sink. However, the reduction of the size and the increased density of devices have limited the available space around the CPU along with the heat sink size, resulting in a constraint on the cooling capacity.

In comparison with this, in a cooling system using heat transport means, such as heat pipes or liquid cooling devices, a heat radiation unit can be provided in any desired position and has less limit in size, resulting in the higher limit of cooling than that of an air cooling system. For this reason, attempts have been made to apply such heat transport means to the CPU and other constituent elements of electronic devices in recent years.

An example of cooling system using such heat transport means according to the prior art is disclosed in JP-A-10-50910 (Patent Reference 1) wherein a heat pipe is used. According to this art, heat from the CPU is transported to an opening of the device by a heat pipe and emitted out from the opening by a fan, and therefore, it is said that the heat generated by the CPU may not raise the temperature of other constituent elements.

On the other hand, an example of liquid cooling system according to the prior art is disclosed in JP-A-10-213370 (Patent Reference 2). According to this art, highly efficient cooling may be provided by collectively transporting heat from heat generating bodies distributed in the device, such as the CPU and the HDD, to the vicinity of the power supply unit, and passing the air flow sucked by the cooling fan of the power unit through a heat radiating unit consisting of cooling pipes provided with a large number of fins.

As described above, the cooling system using heat transport means has a higher cooling limit than a direct air cooling system. However, if the heat radiation unit is arranged within a housing as in Patent Reference 1 cited above, there is a problem in that, when the fan is slowed down in order to reduce noise, the heat from the heat radiation unit fills the inner space of the housing. There is another problem in that an increase in the size of the heat radiation unit would invite enlargement of the whole device, which would mean a greater installation space.

In the structure according to the art disclosed in Patent Reference 2, the heat radiation unit is cooled by the air blown by the power unit fan. Where the power unit is small, however, a corresponding power unit fan would be small, and however, there arises a problem in that the quantity of air flow passing through the heat radiation unit is reduced and the heat radiation unit cannot sufficiently be cooled.

SUMMARY OF THE INVENTION

An object of the present invention is to solve these problems and to provide a more effective heat dissipation structure, thereby making it possible to mount high heat generation components in a small housing, and to reduce noise.

In order to achieve the object described above, an electronic device according to the invention comprises a heat receiving member attached to a heat generating component installed in a housing; a fan, attached on a part of a wall of said housing, for discharging air within the housing out of the housing; a heat sink having a base and fins arranged on the base, the sink being attached, opposite said fan, on an outer face of the wall of said housing or protruding out of the wall with said fins facing the housing; and heat transport means connected to the heat sink and said heat receiving member.

In order to achieve the object described above, an electronic device according to the invention comprises a heat generating component installed in a housing; a heat receiving member having within it a liquid flow channel and an inlet and an outlet of the liquid flow channel; a fan, attached on a part of a wall of said housing, for discharging air within the housing out of the housing; a heat sink provided with a base having a liquid flow channel and an inlet and an outlet of the liquid and fins arranged on the base, the sink being attached, opposite said fan, on an outer face of the wall of said housing or protruding out of the wall with said fins facing the housing; piping for connecting the inlet and the outlet of the liquid flow channel of said heat sink and the outlet and the inlet of the liquid flow channel of said heat receiving member; and a pump provided on the way of said piping.

In order to achieve the object described above, an electronic device according to the invention comprises a heat generating component installed in a housing; a heat receiving member attached to the heat generating component; a fan, attached in a higher position than said heat receiving member and on a part of a wall of said housing, for discharging air within the housing out of the housing; a heat sink provided with a base and fins arranged on the base, the sink being attached, opposite said fan, on the outer face of the wall of said housing or protruding out of the wall with said fins facing the housing; and a heat pipe connected to the heat sink and the heat receiving member.

In order to achieve the object described above, an electronic device according to the invention comprises a heat generating component installed in a housing; a heat receiving member attached to the heat generating component; a power supply unit accommodated in a case having an air intake port; a fan, attached on a part of a wall of said housing, for discharging air within the housing out of the housing; a duct for connecting an air intake side of said fan and an opening formed in the case of said power supply unit; a heat sink provided with a base and fins arranged on the base, the sink being attached, opposite said fan, on an outer face of the wall of said housing or protruding out of the wall with said fins facing the housing; and heat transport means connected to the heat sink and said heat receiving member.

In order to achieve the object described above, an electronic device according to the invention comprises a heat generating component installed in a housing; a heat receiving member attached to the heat generating component and having within it a liquid flow channel and an inlet and an outlet of the liquid flow channel; a power supply unit accommodated in a case having an air intake port; a fan, attached on a part of a wall of said housing, for discharging air within the housing out of the housing; a duct for connecting an air intake side of said fan and an opening formed in the case of said power supply unit; a heat sink provided with a base having a liquid flow channel and an inlet and an outlet of the liquid and fins arranged on the base, the sink being attached, opposite said fan, on an outer face of the wall of said housing or protruding out of the wall with said fins facing the housing; piping for connecting the inlet and the outlet of the liquid flow channel of said heat sink and the outlet and the inlet of the liquid flow channel of said heat receiving member; and a pump provided on the way of said piping.

In order to achieve the object described above, an electronic device according to the invention comprises a heat generating component installed in a housing; a heat receiving member attached to the heat generating component; a power supply unit accommodated in a case having an air intake port; a fan, attached in a higher position than said heat receiving member and on a part of a wall of said housing, for discharging air within the housing out of the housing; a duct for connecting an air intake side of said fan and an opening formed in the case of said power supply unit; a heat sink provided with a base and fins arranged on the base, the sink being attached, opposite said fan, on an outer face of the wall of said housing or protruding out of the wall with said fins facing the housing; and a heat pipe connected to the heat sink and the heat receiving member.

In order to achieve the object described above, an electronic device according to the invention comprises a heat generating component installed in a housing; a heat receiving member attached to the heat generating component; a fan, attached on a part of a wall of said housing, for discharging air within the housing out of the housing; a power supply unit attached on an air suction side of the fan; a heat sink provided with a base and fins arranged on the base, the sink being attached, opposite said fan, on an outer face of the wall of said housing or protruding out of the wall with said fins facing the housing; and heat transport means connected to the heat sink and the heat receiving member.

In order to achieve the object described above, an electronic device according to the invention comprises a heat generating component installed in a housing; a heat receiving member attached to the heat generating component and having within it a liquid flow channel and an inlet and an outlet of the liquid flow channel; a fan, attached on a part of a wall of said housing, for discharging air within the housing out of the housing; a power supply attached to an air intake side of the fan; a heat sink provided with a base having a liquid flow channel and an inlet and an outlet of the liquid and fins arranged on the base, the sink being attached, opposite said fan, on an outer face of the wall of said housing or protruding out of the wall with said fins facing the housing; piping for connecting the inlet and the outlet of the liquid flow channel of said heat sink and the outlet and the inlet of the liquid flow channel of said heat receiving member; and a pump provided on the way of said piping.

In order to achieve the object described above, an electronic device according to the invention comprises a heat generating component installed in a housing; a heat receiving member attached to the heat generating component; a fan, attached in a higher position than said heat receiving member and on a part of a wall of said housing, for discharging air within the housing out of the housing; a power supply attached to an air intake side of the fan; a heat sink provided with a base and fins arranged on the base, the sink being attached, opposite said fan, on an outer face of the wall of said housing or protruding out of the wall with said fins facing the housing; and a heat pipe connected to the heat sink and the heat receiving member.

In order to achieve the object described above, an electronic device according to the invention comprises a heat generating component installed in a housing; a heat receiving member attached to the heat generating component; a power supply unit accommodated in a case whose face having an opening is attached to a wall having an opening of said housing; a fan, attached to another face of the case of the power supply unit than the face attached to the wall of said housing, for discharging air within the housing out of the housing via said power supply unit; a heat sink having a base and fins arranged on the base, the sink being attached, opposite said power supply unit, on an outer face of the wall of said housing or protruding out of the wall with said fins facing the housing; and heat transport means connected to the heat sink and the heat receiving member.

In order to achieve the object described above, an electronic device according to the invention comprises a heat generating component installed in a housing; a heat receiving member attached to the heat generating component and having within it a liquid flow channel and an inlet and an outlet of the liquid flow channel; a power supply unit accommodated in a case whose face having an opening is attached to a wall having an opening of said housing; a fan, attached to another face of the case of the power supply unit than the face attached to the wall of said housing, for discharging air within the housing out of the housing via said power supply unit; a heat sink provided with a base, having within it a liquid flow channel and an inlet and an outlet of the liquid flow channel, and fins arranged on the base, the sink being attached, opposite said power supply unit, on an outer face of the wall of said housing or protruding out of the wall with said fins facing the housing; piping for connecting the inlet and the outlet of the liquid flow channel of said heat sink and the outlet and the inlet of the liquid flow channel of said heat receiving member; and a pump provided on the way of the piping.

In order to achieve the object described above, an electronic device according to the invention comprises a heat generating component installed in a housing; a heat receiving member attached to the heat generating component; a power supply unit accommodated in a case whose face having an opening is attached to a wall having an opening of said housing in a position higher than the heat receiving member; a fan, attached to another face of the case of the power supply unit than the face attached to the wall of said housing, for discharging air within the housing out of the housing via said power supply unit; a heat sink having a base and fins arranged on the base, the sink being attached, opposite said power supply unit, on an outer face of the wall of said housing or protruding out of the wall with said fins facing the housing; and a heat pipe connected to the heat sink and the heat receiving member.

A tank may also be provided on the way of the piping.

Further, the base and fins of the heat sink are preferably made a metal excellent in heat transmission performance, and the fins are an array of a plurality of pins.

Also, the heat sink is attached to the back of the housing, where a cable from outside may be connected.

Other objects, features and advantages of the invention will become apparent from the following description of the embodiments of the invention taken in conjunction with the accompanying drawings.

DETAILED DESCRIPTION OF THE INVENTION

Figure 1:
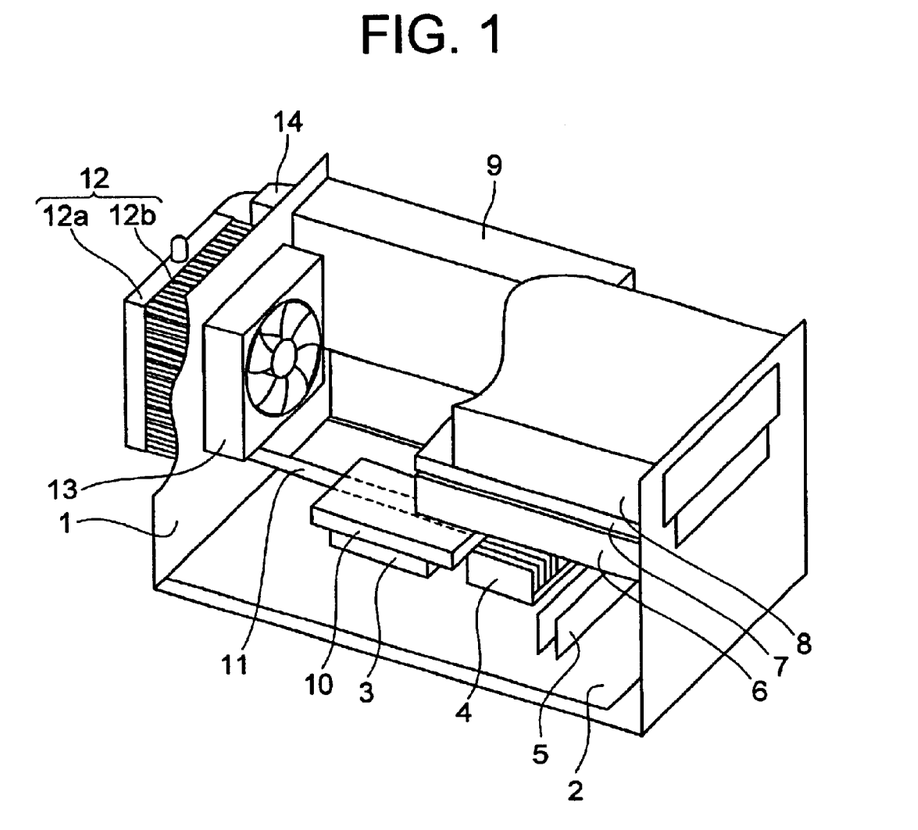
FIG. 1 is a perspective view showing a first embodiment of the present invention.

Embodiments of the present invention will be described hereinafter. Examples shown in the present specification are ones in which the present invention is applied to cooling of CPU mounted in an electronic device which is a desktop type personal computer (hereinafter, referred to desktop PC). FIG. 1 is a perspective view of a desktop PC showing a first embodiment of the invention. In this embodiment, heat pipes are used as the heat transport means.

To describe the overall configuration first, in a housing 1, near a bottom of the housing 1, there is a mother board 2, on which are mounted a CPU 3, a chip set 4 and a memory 5. Of these constituents, the CPU 3 is a part to highly generates heat. As external storage devices, an HDD 6, an FDD 7 and a CD-ROM 8 are also mounted. A heat receiving header 10 is attached on the CPU 3 as a heat receiving member, and to the heat receiving header 10 is attached one end of a heat pipe 11 as a heat transport means. To briefly describe the structure of the heat pipe 11, it is a hollow copper pipe charged inside with pure water at a very low pressure, and this pure water serves as working fluid to transfer heat.

Next, the heat receiving header 10 will be described. The heat receiving header 10 is made of a metal excellent in heat transmission performance, such as copper or aluminum. Its face of contact with the CPU 3 is pressure-fitted to the CPU 3 with thermal compound, highly heat-transmissive silicon rubber or the like intervening between them, so that heat generated in the CPU 3 can be efficiently transferred to the heat receiving header 10. Within the heat receiving header 10, one end of the heat pipe 11 is embedded so that heat received by the heat receiving header 10 can be transferred to the heat pipe 11. Thus the structure enables heat from the CPU 3 to be efficiently transferred to the heat pipe 11.

To the back of the housing 1 is attached a fan 13, which is an axial fan whose suction side is located inside the housing 1. To the outside back of the housing is attached a heat sink 12, which is the heat radiation unit, opposite the fan 13. The heat sink 12 is made of a metal excellent in heat transmission performance such as copper or aluminum, and comprises a base 12a and fins 12b. The shape of the fins 12b is such that pins are arranged in a matrix, but the pins may as well be arranged in a zigzag fashion or the fins may comprise flat plates arranged successively. The fins 12b are so disposed as to face the back of the housing. In other words, the fins 12b are exposed to the air blown by the fan 13. In the base 12a is embedded one end of the heat pipe 11, so that heat transferred from the CPU 3 to the heat pipe 11 can be efficiently transmitted.

Figure 2:
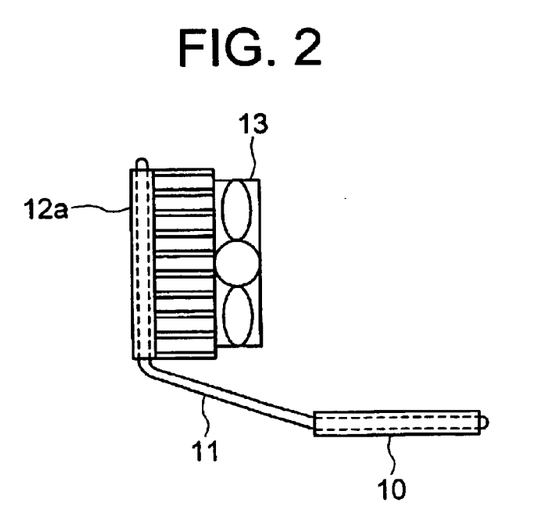
FIG. 2 is side view of a cooling section of the first embodiment of the invention.

The heat pipe 11 is inclined upward in the part between the heat receiving header 10 and the heat sink 12 as shown in FIG. 2, and bent appropriately upward near the base 12a to be connected to the base 12a. Thus, since the CPU 3, which is the heat source, is positioned lower than the heat sink 12, i.e. in a bottom-heating state, working fluid within the heat pipe 11 can efficiently convey the heat. Action of the working fluid will be described in detail hereinafter. Adjoining the fan 13 is a power supply unit 9, to which an AC cable 14 is connected from outside.

Although the heat sink 12 is attached outside the housing in this embodiment, it may as well be so attached that one part of it be present within, and the rest protruding from the back of, the housing.

Next, the heat dissipation structure of this embodiment will be described. First, the CPU 3 generates heat and the heat is transferred to the heat receiving header 10 attached to the CPU 3. At this time, an outer circumference of the heat pipe 11 is covered by the heat receiving header 10, and therefore, the heat from the CPU 3 is efficiently transferred to the heat pipe 11. Therefore, within the heat pipe 11 in contact with the heat receiving header 10, the working fluid contained therein is evaporated by the transferred heat. In other words, this part constitutes an evaporating section of the heat pipe 11.

The working fluid which has been converted into vapor flows towards an end of the heat pipe 11 arranged in the heat sink 12, where both the temperature and the internal pressure is low, and is condensed by being drawn the heat by the heat sink 12. Therefore, an end of the heat pipe 11 at a side of the heat sink 12 constitutes a condensing section. Since the heat pipe 11 is arranged in an inclined state as described above, it operates in a bottom-heating state, and the cycle of evaporation and condensation of the working fluid takes place smoothly, resulting in a high heat transfer capacity. The working fluid having been condensed and returned to the liquid phase is fed back through inside the heat pipe 11 to the evaporating section, where it is heated again and evaporates. The heat of the CPU 3 transferred from the heat pipe 11 to the base 12a of the heat sink 12 is transferred to substantially all over the base 12a and to the fins 12b.

Figure 3:
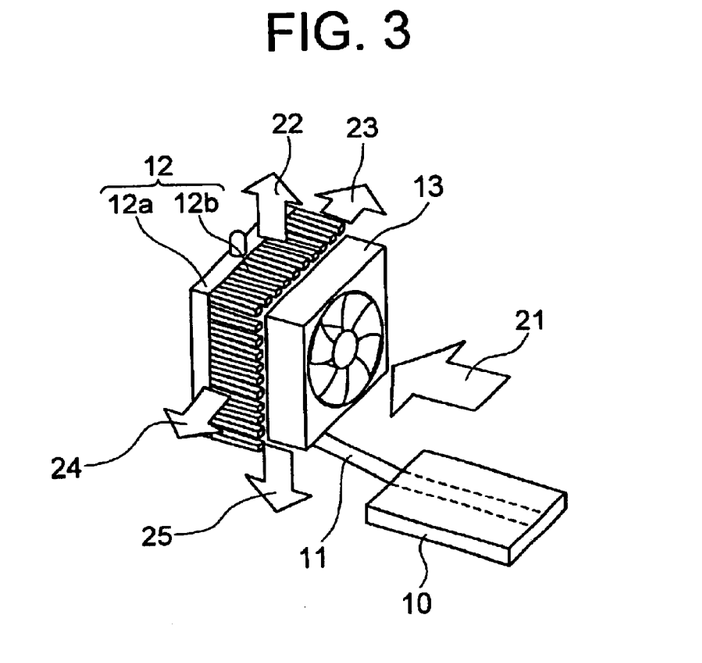
FIG. 3 is a perspective view of the cooling section of the first, second and third embodiments of the invention.

Then, when the fan 13 is started to run, the air in the housing 1 flows in the direction of arrow 21 in FIG. 3. This air passes the fins 12b of the heat sink 12, collides against the base 12a and is discharged in the directions of arrows 22, 23, 24 and 25. This stream of air causes the heat transferred to the base 12a and the fins 12b of the heat sink 12 to be discharged. Although only one heat pipe is used in this embodiment of the invention, a plurality of heat pipes may be used. Further, the heat sink 12 may be provided with a cover so that nobody can directly touch it from outside. This cover may be integrally molded with the housing 1.

Since the heat sink 12 for cooling the CPU 3 is attached to the outside of the housing 1 in the first embodiment described above, if a CPU 3 generating a large quantity of heat is to be used or the CPU 3 emits a greater than expected quantity of head, it will be sufficient to use a larger heat sink 12 outside the housing, but the size of the housing 1 itself need not be enlarged. Moreover, as there is no need to consider the arrangement of the heat sink 12 for cooling the CPU 3, the size of the housing 1 (electronic device) can be made small. Furthermore, because the heat sink 12 is arranged on the back of the housing where a cable from outside, for instance the AC cable 14, is connected, the expansion of the installation space required for the heat sink 12 can be restrained.

Figure 7:
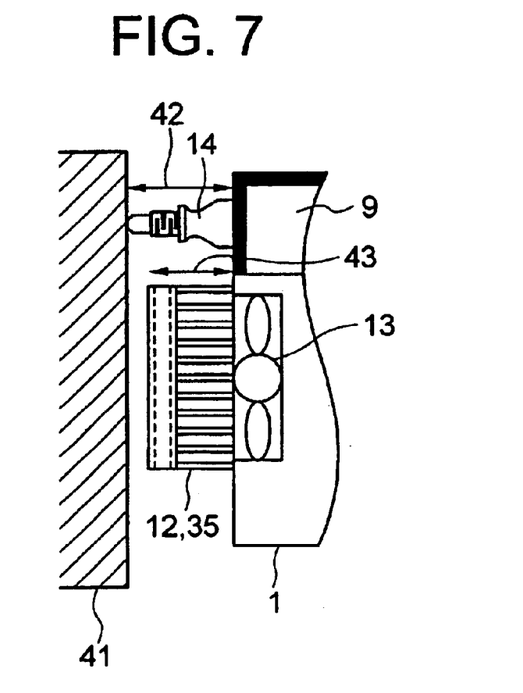
FIG. 7 is a top view of the cooling section of the first, second and third embodiments of the invention.

To explain this point in more specific terms with reference to FIG. 7, which shows a top view of the electronic device, a distance between a wall 41 and the housing 1 of the electronic device needs to be as long as a curved portion 42 of the AC cable 14 on the back of the housing, but if the length 43 of the heat sink 12 is smaller than this distance 42, an effective installation space will not increase. Even if the length 43 of the heat sink 12 is somewhat great, the effective installation space will not substantially increase. Further as the exhaust direction from the heat sink 12 is parallel to the wall 41, the exhaust will not be blocked even if the heat sink 12 is in contact with the wall 41.

The heat sink 12 excels in cooling efficiency, because, as shown in FIG. 3, the stream of flow 21 from the fan 13, is discharged while colliding against the base 12a, which is the hottest part of the heat sink 12, namely it constitutes a collision jet.

Now, the noise suppressing effect of this embodiment of the invention will be explained. When the fan 13 is stopped, the flows of air from the fan 13 in the directions of the arrow 21, 22, 23, 24 and 25 shown in FIG. 3 will stop, and there will still be a slow stream of air in the direction of the arrow 22 due to natural convection because the temperature in the heat sink 12 is higher than the ambient temperature. Since the heat in the direction of the arrow 22 is discharged out of the housing, this heat does not raise the temperature within the housing. Thus, even when the fan 13 is stopped, there will remain a cooling effect to some extent. Therefore, when the CPU 3 is under light load and generates little heat, the CPU 3 can be cooled even if the fan 13 is stopped. When the fan 13 is not running, the main source of noise is a power unit fan built into the case of the power supply unit 9, and accordingly noise emission can be suppressed.

Figure 4:
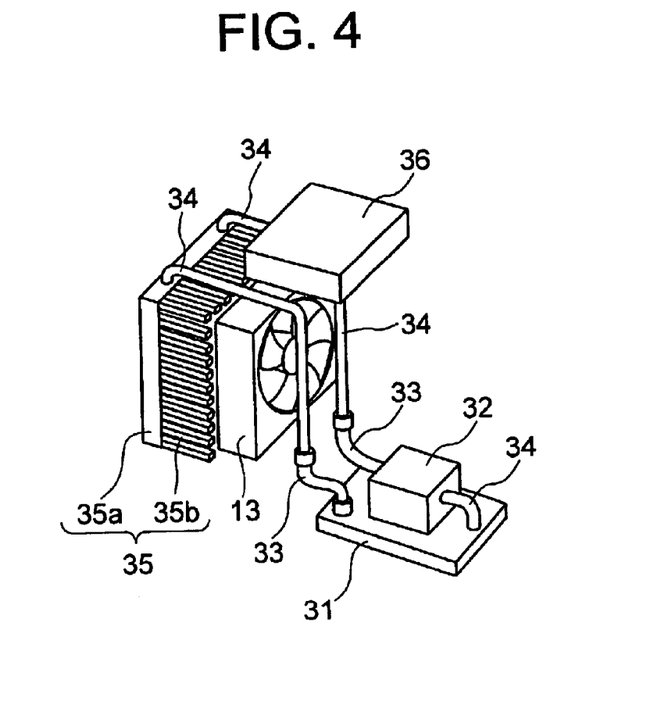
FIG. 4 is a perspective view of the cooling section of the second embodiment of the invention.

Next, a second embodiment of the present invention will be described, with reference to FIG. 4, in which a liquid cooling system by which cooling liquid is forcibly circulated with a pump is used as heat transport means. Incidentally, since other elements than the liquid cooling system are configured in the same way as their respective counterparts in the first embodiment described above, their description and illustration will be omitted.

Figure 5:
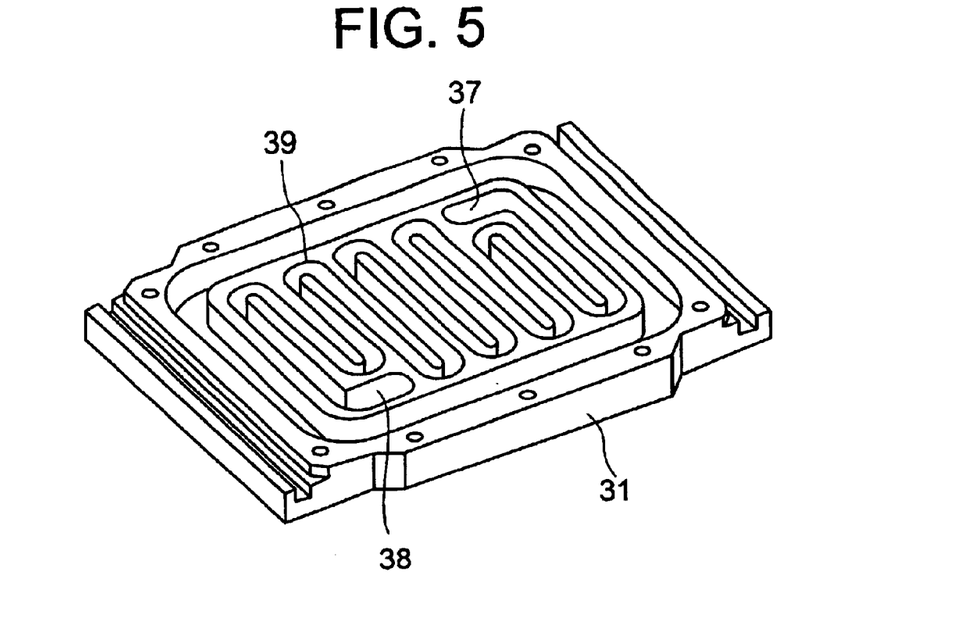
FIG. 5 is a structural view of a heat receiving header of the second embodiment of the invention.

In a heat receiving header 31 attached to the CPU 3, though its face of contact with the CPU 3 is the same as in the first embodiment, cooling liquid flows within the system and heat is transferred to the cooling liquid. FIG. 5 illustrates an inner structure of the heat receiving header 31. This is a structure in which a meandering groove 39 is formed in a plate made of a metal excellent in heat transmission performance, such as copper or aluminum, and is sealingly closed by a cover. With this, a meandering flow path is formed and the cooling liquid enters an inlet 37, passes the meandering flow path, and flows out of an outlet 38.

A pump 32 is intended for circulating the cooling liquid between the heat receiving header 31 and a heat sink 35. Incidentally, although the pump 32 is positioned on the heat receiving header 31, it may be arranged elsewhere. A tube 33 and a metal pipe 34 connect the heat receiving header 31 and the heat sink 35 and, by letting the cooling liquid within it, constitute a heat transfer path from the heat receiving header 31 to the heat sink 35.

Regarding the overall piping arrangement, metal pipes are mainly used, partially supplemented with the rubber tube 33. As this tube 33 can be bent, maintenance work including the replacement of the CPU 3 becomes easy. In other words, the heat receiving header 31 can be detached from the CPU 3 without having to remove the fan 13 or the heat sink 35. Using metal pipes elsewhere than the tube 33 serves to suppress permeation of moisture.

Figure 6:
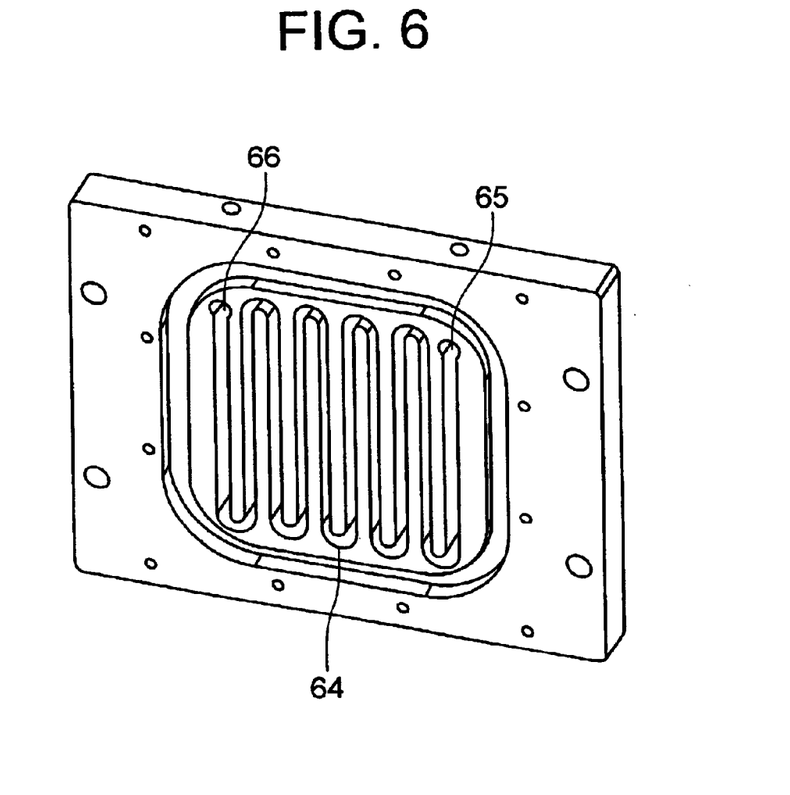
FIG. 6 is a structural view of a base of a heat sink of the second embodiment of the invention.

The heat sink 35 comprises a base 35a and the fins 35b. Within the base 35a cooling liquid flows, and the structure is such that the heat of the cooling liquid is transferred to the whole base 35a. FIG. 6 illustrates an inner structure of the base 35a. It is basically the same structure as the heat receiving header 31, a structure in which a meandering groove 64 is formed in a plate made of a metal excellent in heat transmission performance, such as copper or aluminum, and is sealingly closed by a cover. With this, a meandering flow path is formed and the cooling liquid enters an inlet 65, passes the meandering channel, and flows out of an outlet 66. Referring back to FIG. 4, on the back of the base 35a, pins of a metal excellent in heat transmission performance, such as copper or aluminum, are arranged in a matrix similarly to the first embodiment. The arrangement of the heat sink 35 relative to the housing 1 is also the same as in the first embodiment.

A reserve tank 36 is provided in communication with the metal pipe 34. This reserve tank 36, basically intended as the cooling liquid reservoir, has the following two additional functions. One is to serve as the reservoir for air which may come in when the cooling liquid decreases as a result of the evaporation of moisture, and the other is to function as an access port for letting cooling liquid into or out of the liquid cooling system from or to the outside. Although the reserve tank 36 is positioned above the fan 13 in this embodiment of the invention, it may be arranged elsewhere.

The flow path of the cooling liquid comprises the pump 32, the inlet 37 of the heat receiving header 31, the outlet 38 of the heat receiving header 31, the inlet 65 of the base 35a of the heat sink 35, the outlet 66 of the base 35a, the reserve tank 36 and the pump 32 again in this sequence. Thus the direction in which the pump 32 makes to flow the cooling liquid is such that it sucks the cooling liquid having passed the heat sink 35 and discharges it into the heat receiving header 31. This arrangement serves to let the cooled cooling liquid flow to the pump 32 to prevent the pump 32 from being heated.

Figure 8:
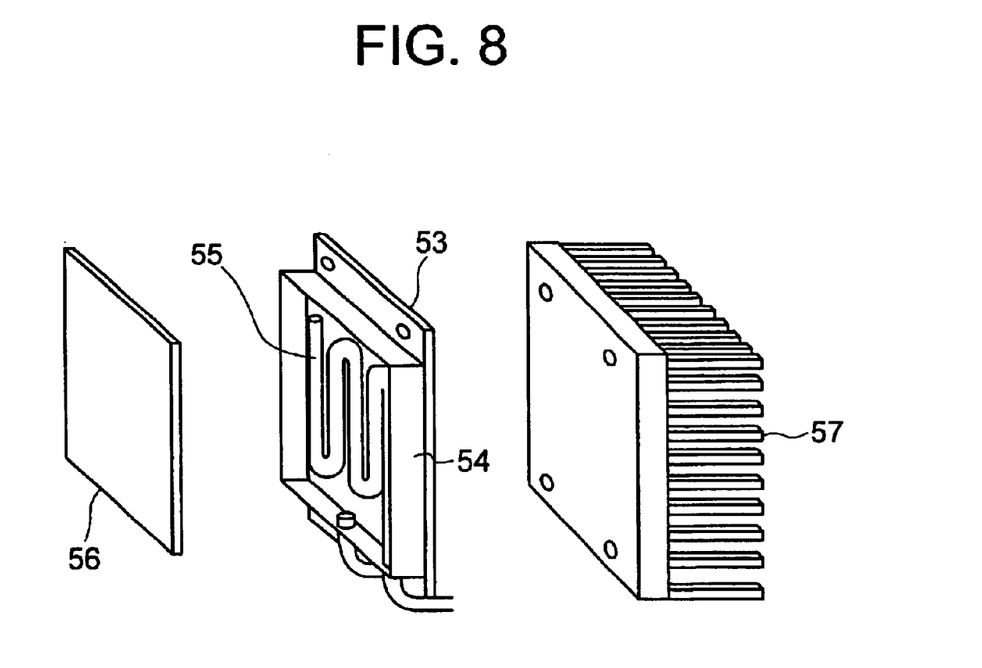
FIG. 8 is another exploded structural view of the heat sink of the second embodiment of the invention.

Other examples of configuration of the heat sink 35 will now be described with reference to FIG. 8, FIG. 9 and FIG. 10. In the example shown in FIG. 8, a base is composed by providing an enclosure 54 made of a metal excellent in heat transmission performance, such as copper or aluminum, over a thin plate 53 also made of a metal excellent in heat transmission performance, such as copper or aluminum, arranging in this enclosure a meandering pipe 55 in which to let cooling liquid flow, and sealingly closing the enclosure with a cover 56, and to the back of this base is fixed a metal plate on which pins 57 also made of a metal excellent in heat transmission performance, such as copper or aluminum, are arranged in a matrix.

Figure 9:
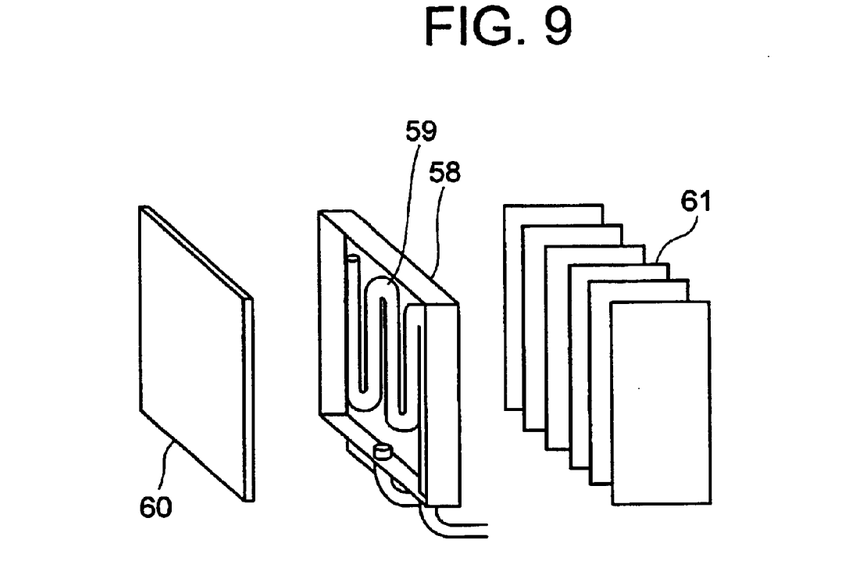
FIG. 9 is a still another exploded structural view of the heat sink of the second embodiment of the invention.

In the example shown in FIG. 9, a base is composed by arranging a meandering pipe 59 in an accommodating box 58 made of a metal excellent in heat transmission performance, such as copper or aluminum, and sealingly closing the box with a cover 60, and a plurality of fins also made of a metal excellent in heat transmission performance, such as copper or aluminum, are arranged on the back of this base.

Figure 10:
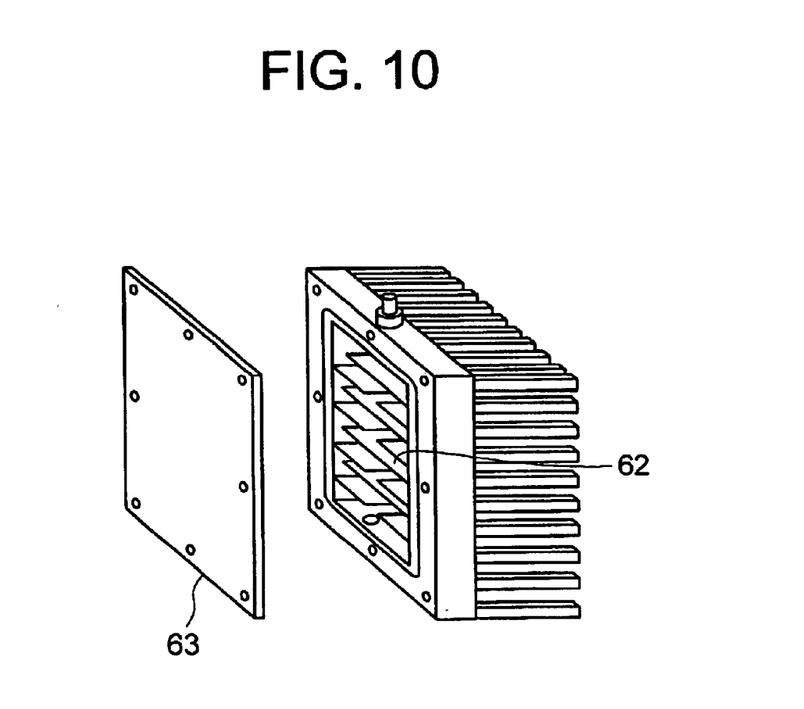
FIG. 10 is yet another structural view of the heat sink of the second embodiment of the invention.

In the example shown in FIG. 10, the base 35a in the second embodiment described above is made hollow, a plurality of fins 62 made of a metal excellent in heat transmission performance, such as copper or aluminum, are arranged horizontally so that gaps are left between the fins, and the base is sealingly closed by a cover 63. The cooling liquid flowing into the base travels along the surfaces of the fins and drop down through the gaps between the fins.

With these structures, even if air is let into the circulation channel by the permeation of moisture or otherwise, the air coming out of the discharge port or the inlet accumulates in an upper part in the heat sink base. Thus, the heat sink base in these structures, like the tank in another structure, has the function of letting air in circulation channel accumulate. Therefore, the tank can be omitted if an access port for injecting and discharging the cooling liquid is provided in the heat sink base or elsewhere.

This second embodiment of the invention, which has the same effect as the first embodiment described earlier, has a greater cooling effect than the first embodiment because it has a meandering channel within the base of the heat receiving header and the base of the heat sink.

A third embodiment of the present invention, which is even more effective in suppressing noise, will now be described with reference to FIG. 11, FIG. 12, FIG. 13 and FIG. 14. Since the third embodiment is the same in configuration as the above-described first and second embodiments in other respects than the arrangement and connection of the fan 13 and the power supply unit 9, the illustration and description of these similar aspects will be omitted.

Figure 11:
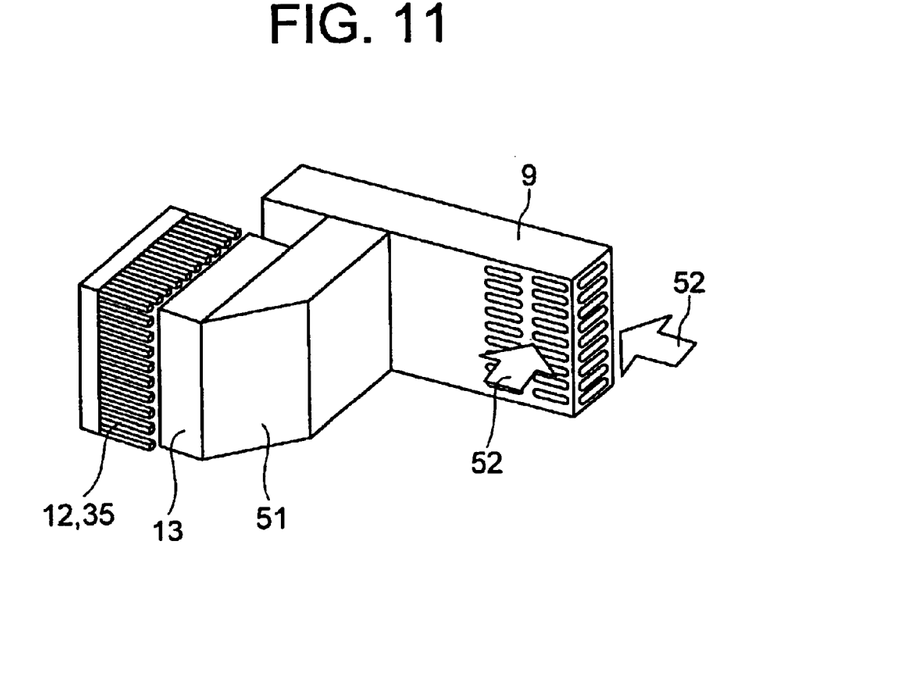
FIG. 11 is a perspective view of the cooling section of the third embodiment of the invention.

In the configuration shown in FIG. 11, an opening is formed in a side with no air intake port provided on the case of the power supply unit 9, and this opening and an air intake side of the fan 13 are connected by a duct 51 so that air is taken in via the power supply unit 9. The air in the housing is sucked in the direction indicated by an arrow 52, flows into the case from the air intake port of the power supply unit 9, and discharged into the duct 51 via the power supply unit 9. Since the power supply unit 9 can be cooled by the exhaust flow sucked by the fan 13, the power unit fan can be omitted, resulting in further noise suppression.

Figure 12:
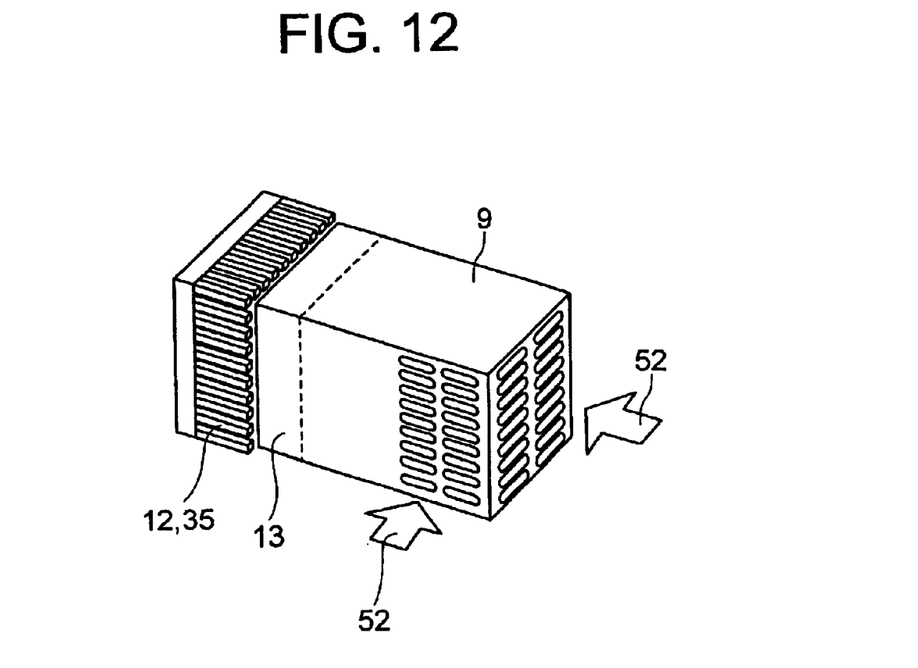
FIG. 12 is a perspective view of another structural view of the cooling section of the third embodiment of the invention.

In the configuration illustrated in FIG. 12, the power supply unit 9 is attached to the air intake side of the fan 13. The power supply unit 9 is accommodated in a case, an opening or an exhaust port is formed in a face of the case where the fan 13 is attached, and an air intake port is formed on an opposite side. The revolutions of the fan 13 cause the air in the housing to flow in the direction of the arrow 52 and to be discharged into the heat sink 12 or 35 via the power supply unit 9. Since the power supply unit 9 can be cooled by the exhaust flow in this configuration, too, the power unit fan can be omitted. Accordingly, it can achieve further noise suppression than the first and second embodiments described above.

Figure 13:
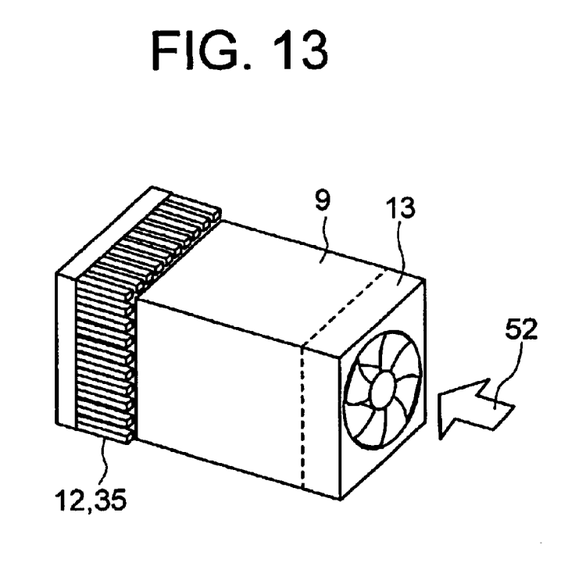
FIG. 13 is a perspective view of still another structural view of the cooling section of the third embodiment of the invention.
Figure 14:
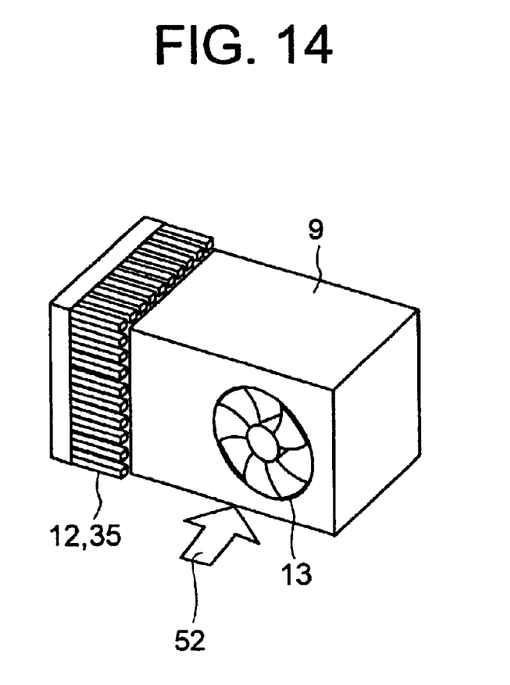
FIG. 14 shows a perspective view of yet another structural view of the cooling section of the third embodiment of the invention.

In the configuration illustrated in FIG. 13, the arrangement of the fan 13 and the power supply unit 9 in FIG. 12 is reversed. The configuration shown in FIG. 14 differs from that of FIG. 13 in that the fan 13 is provided on a side of the case of the power supply unit 9.

The noise suppressing effect of the third embodiment of the invention specifically is an approximately 24 dB greater noise reduction than the air cooling system.

According to the present invention, heat dissipation from highly heat generating constituent elements can be effectively achieved without having to increase the size of the housing and with restraint on the enlargement of the installation space.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. An electronic device comprising:
   a housing;
   a heat generating component installed in the housing;
   a heat receiving member attached to the heat generating component;
   a fan, attached on a part of a wall of said housing, for discharging air within the housing out of the housing;
   a heat sink having a base and fins arranged on the base, the sink being attached, opposite said fan, on an outer face of the wall of said housing or protruding out of the wall with said fins facing the housing; and
   heat transport means connected to the heat sink and said heat receiving member.

2. The electronic device according to claim 1, further comprising:
   a power supply unit accommodated in a case having an air intake port; and
   a duct for connecting an air intake side of said fan and an opening formed in the case of said power supply unit.

3. The electronic device according to claim 1, wherein said heat receiving member has within it a liquid flow channel and an inlet and an outlet of the liquid flow channel,
   said heat sink is provided with a base having within it a liquid flow channel and an inlet and an outlet of the liquid flow channel, and
   said heat transport means connects the inlet and the outlet of the liquid flow channel of said heat sink and the outlet and the inlet of the liquid flow channel of said heat receiving member, and
   a pump is further provided on the way of said heat transport means.

4. The electronic device according to claim 3, further comprising:
   a power supply unit accommodated in a case having an air intake port; and
   a duct for connecting an air intake side of said fan and an opening formed in the case of said power supply unit.

5. The electronic device according to claim 4, wherein a tank is further provided on the way of said heat transport means.

6. The electronic device according to claim 3, wherein a tank is further provided on the way of said heat transport means.

7. The electronic device according to claim 1, wherein
said fan is attached in a higher position than said heat receiving member and on a part of a wall of said housing, and
said heat transport means comprises a heat pipe.

8. The electronic device according to claim 7, further comprising:
a power supply unit accommodated in a case having an air intake port, and
a duct for connecting an air intake side of said fan and an opening formed in the case of said power supply unit.

9. The electronic device according to claim 1, further comprising a power supply unit attached to an air intake side of said fan.

10. The electronic device according to claim 9, wherein
said heat receiving member has within it a liquid flow channel and an inlet and an outlet of the liquid flow channel,
said heat sink is provided with a base having within it a liquid flow channel and an inlet and an outlet of the liquid flow channel, and
said heat transport means connects the inlet and the outlet of the liquid flow channel of said heat sink and the outlet and the inlet of the liquid flow channel of said heat receiving member, and
a pump is further provided on the way of said heat transport means.

11. The electronic device according to claim 10, wherein a tank is further provided on the way of said heat transport means.

12. The electronic device according to claim 9, wherein
said fan is attached at a higher position than said heat receiving member and on a part of a wall of said housing, and
said heat transport means comprises a heat pipe.

13. The electronic device according to claim 1, wherein
the base and fins of said heat sink are made of a metal excellent in heat transmission performance, and
said fins are an array of a plurality of pins.

14. The electronic device according to claim 1, wherein said heat sink is attached to the back of said housing where a cable from outside is connected.

15. An electronic device comprising:
a housing;
a heat generating component installed in the housing;
a heat receiving member attached to the heat generating component;
a power supply unit accommodated in a case whose face having an opening is attached to a wall having an opening of said housing;
a fan, attached to another face of the case of the power supply unit than the face attached to the wall of said housing, for discharging air within the housing out of the housing via said power supply unit;
a heat sink having a base and fins arranged on the base, the sink being attached, opposite said power supply unit, on an outer face of the wall of said housing or protruding out of the wall with said fins facing the housing; and
heat transport means connected to the heat sink and said heat receiving member.

16. The electronic device according to claim 15, wherein
said heat receiving member has within it a liquid flow channel and an inlet and an outlet of the liquid flow channel,
said heat sink is provided with a base having within it a liquid flow channel and an inlet and an outlet of the liquid flow channel, and
said heat transport means connects the inlet and the outlet of the liquid flow channel of said heat sink and the outlet and the inlet of the liquid flow channel of said heat receiving member, and
a pump is further provided on the way of said heat transport means.

17. The electronic device according to claim 16, wherein a tank is further provided on the way of said heat transport means.

18. The electronic device according to claim 15, wherein:
said fan is attached at a higher position than said heat receiving member and on a part of a wall of said housing, and
said heat transport means comprises a heat pipe.

* * * * *